United States Patent
Chen et al.

(10) Patent No.: US 11,966,587 B2
(45) Date of Patent: Apr. 23, 2024

(54) METHOD FOR OPTIMIZING POLAR-RNNA QUANTIZER OF MLC-TYPE NAND FLASH MEMORY ON BASIS OF DEEP LEARNING

(71) Applicant: FUZHOU UNIVERSITY, Fujian (CN)

(72) Inventors: Pingping Chen, Fujian (CN); Zhen Mei, Fujian (CN); Yi Fang, Fujian (CN); Xu Luo, Fujian (CN); Zhijian Lin, Fujian (CN); Feng Chen, Fujian (CN); Riqing Chen, Fujian (CN)

(73) Assignee: FUZHOU UNIVERSITY, Fujian (CN)

( * ) Notice: Subject to any disclaimer, the term of this patent is extended or adjusted under 35 U.S.C. 154(b) by 22 days.

(21) Appl. No.: 17/905,351

(22) PCT Filed: Nov. 8, 2021

(86) PCT No.: PCT/CN2021/129180
§ 371 (c)(1),
(2) Date: Aug. 31, 2022

(87) PCT Pub. No.: WO2022/160847
PCT Pub. Date: Aug. 4, 2022

(65) Prior Publication Data
US 2023/0127404 A1    Apr. 27, 2023

(30) Foreign Application Priority Data
Jan. 26, 2021 (CN) .......................... 202110101188.9

(51) Int. Cl.
*G06F 3/06* (2006.01)
(52) U.S. Cl.
CPC .......... *G06F 3/0614* (2013.01); *G06F 3/0629* (2013.01); *G06F 3/0679* (2013.01)
(58) Field of Classification Search
CPC ..... G06F 3/0614; G06F 3/0629; G06F 3/0679
See application file for complete search history.

(56) References Cited

U.S. PATENT DOCUMENTS 9,431,118 B1 * 8/2016 Bar .................. G11C 16/26
9,513,982 B1 * 12/2016 Wu .................. B29C 64/153
(Continued)

FOREIGN PATENT DOCUMENTS

| CN | 16504796 A | 3/2017 |
| CN | 112929033 A | 6/2021 |

OTHER PUBLICATIONS

Z. Mei, K. Cai and X. He, "Deep Learning-Aided Dynamic Read Thresholds Design for Multi-Level-Cell Flash Memories," in IEEE Transactions on Communications, vol. 68, No. 5, pp. 2850-2862, May 2020, doi: 10.1109/TCOMM.2020.2974723. (Year: 2020).*

*Primary Examiner* — Eric T Oberly
(74) *Attorney, Agent, or Firm* — Jose Cherson Weissbrot

(57) ABSTRACT

A method for optimizing a Polar-RNNA quantizer of MLC NAND flash based on deep learning comprises the following steps: Step S1: transforming an MLC flash detection task into a deep learning task, and obtaining three hard-decision read thresholds based on a neural network; Step S2: expanding six soft-decision read thresholds based on the three hard-decision read thresholds; Step S3: constructing an LLR mapping table, and obtaining new LLR information of MLC flash based on the LLR mapping table; Step S4: symmetrizing an MLC flash channel, and performing density evolution; and Step S5: optimizing the soft-decision read thresholds based on a genetic algorithm to obtain an optimal quantization interval. According to the invention, polar codes can be directly used for MLC flash channels without the arduous work of MLC flash channel modeling, so that the reliability of MLC flash is effectively improved.

3 Claims, 2 Drawing Sheets

(56) References Cited

U.S. PATENT DOCUMENTS

| | | | |
|---|---|---|---|
| 2015/0227403 A1* | 8/2015 | Zhang | H03M 13/1105 714/704 |
| 2015/0256196 A1 | 9/2015 | Alhussien et al. | |
| 2018/0341543 A1 | 11/2018 | Ha et al. | |
| 2020/0177209 A1 | 6/2020 | Ismail et al. | |

* cited by examiner

US 11,966,587 B2

METHOD FOR OPTIMIZING POLAR-RNNA QUANTIZER OF MLC-TYPE NAND FLASH MEMORY ON BASIS OF DEEP LEARNING

BACKGROUND OF THE INVENTION

1. Technical Field

The invention relates to the field of communication, in particular to a method for optimizing a Polar-RNNA quantizer of MLC NAND flash based on deep learning.

2. Description of Related Art

Compared with traditional hard disk drives, NAND flash-based solid state drives have lower power consumption, faster write/read rate and higher reliability, thus becoming more and more popular on the market. In order to improve the capacity of a data storage system, the MLC (Multi-Level Cell) storage technique and TLC (Trinary-Level Cell) storage technique have gradually replaced the SLC (Single-Level Cell) storage technique.

The work principle of MLC NAND flash is as follows: each memory cell of a memory stores two bits of information, corresponding to stored symbols 11, 10, 00 and 01 respectively. In order to read the data stored in the memory cell, the read-back voltage of the memory cell should be measured and compared with a fixed read threshold through a memory detection circuit. In order to distinguish four levels, at least three read thresholds $\{R_1, R_2, R_3\}$ are needed. However, during the data reading process, the channel distributions of the MLC flash will be distorted by various unpredictable noises and channel offsets, thus severely compromising the reliability of an MLC flash system.

In order to improve the reliability of the MLC system, error correction codes are considered. The polar code is a new code form given based on channel polarization, which was put forward for the first time by Erdal Arikan on the ISIT conference in 2008 and was expounded in further detail in the 23-page paper "A Method for Constructing Capacity-Achieving Codes for Symmetric Binary-Input Memoryless Channels" published in Journal "IEEE Transaction on Information Theory" in 2009. The polar code has become the unique code that can reach the Shannon limit at present due to its particular code pattern construction manner.

As for polar codes decoded by soft-decision, the decoding performance heavily depends, on the accuracy of the log-likelihood ratio (LLR) of coded bits after channel coding. However, the accurate calculation of LLR requires accurate memory cell sensing and high-precision memory induction, which often leads to an excessive expenditure and delay damage of a memory. Generally, more read thresholds of the memory cells are used to quantize a required LLR. For example, a maximum mutual information (MMI) quantizer is widely used to optimize quantization intervals by maximizing the quantity of mutual information of the MLC channel. However, an accurate model of the MLC channel is necessary for the MMI quantizer, which is impossible due to some unknown offsets and noises of the MLC channel.

BRIEF SUMMARY OF THE INVENTION

In view of this, the objective of the invention is to provide a method for optimizing a Polar-RNNA quantizer of MLC NAND flash based on deep learning, which directly uses polar codes for MLC flash channels without the arduous work of MLC flash channel modeling, thus effectively improving the reliability of MLC flash.

To fulfill the above objective, the invention adopts the following technical solution:

A method for optimizing a Polar-RNNA quantizer of MLC NAND flash based on deep learning comprises the following steps:

Step S1: transforming an MLC flash detection task into a deep learning task, and obtaining three hard-decision read thresholds based on a neural network;

Step S2: expanding six soft-decision read thresholds based on the three hard-decision read thresholds;

Step S3: constructing an LLR mapping table, and obtaining LLR soft information of the MLC flash based on the LLR mapping table;

Step S4: symmetrizing the MLC flash channel, and performing density evolution; and Step S5: optimizing the soft-decision read thresholds based on a genetic algorithm to obtain optimal quantization intervals.

Further, Step S1 specifically comprises:

Devoting a read-back voltage of a $k^{th}$ memory cell of the MLC flash by $v_k$, inputting $v=\{v_1, v_2, \ldots, v_L\}$ to the neural network, and setting L as the number of neurons of an input layer, and outputting a soft estimation $\tilde{x}=\{\tilde{x}_1, \tilde{x}_2, \ldots, \tilde{x}_L\}$ of a tag x by the neural network; as for the MLC flash, expressing $\{11, 10, 00, 01\}$ by a tag $\{0, 1, 2, 3\}$, so that a hard estimation $\hat{x}_k \in \{0, 1, 2, 3\}$ of the $k^{th}$ memory cell $x_k \in \{0, 1, 2, 3\}$ is obtained by acquiring integers $\tilde{x}_k$ most approximate to $\tilde{x}$ output by the neural network; then, obtaining a corresponding memory cell symbol through a mapping $\{0, 1, 2, 3\} \rightarrow \{11, 10, 00, 01\}$;

Setting a set of read thresholds $\{R_1, R_2, R_3\}$ for a read-back voltage $\vec{v}$ of a given set of memory cells to obtain a hard estimation of the memory cell symbol, which is denoted by $\bar{x}$; inputting $\vec{v}$ to an RNN detector to obtain a hard estimation $\hat{x}$ of a storage symbol based on a principle of proximity;

Setting, during a search process, N RNN output sequences with a length of L, and denoting an it RNN output sequence as $\hat{x}_i$, so that $\hat{X}=\{\hat{x}_1, \hat{x}_2, \ldots \hat{x}_N\}$, and $\bar{X}=\{\bar{x}_1, \bar{x}_2, \ldots, \bar{x}_N\}$;

Wherein, a formula for calculating optimal thresholds $\{R^*_1, R^*_2, R^*_3\}$ is:

$$\{R_1^*, R_2^*, R_3^*\} = \underset{\{R_1, R_2, R_3\}}{\operatorname{argmin}} \, d(\bar{X}, \hat{X}) \qquad (1)$$

Uniformly quantizing a search space into m interval boundaries $\{B_0, B_1, \ldots, B_m\}$, wherein $B_0=-\infty<B_1=V_{s_{11}}< \ldots <B_{m-1}=V_{s_{01}}<B_m=\infty$; and Searching out the optimal thresholds $\{R^*_1, R^*_2, R^*_3\}$ from $\{B_1, B_2, \ldots, B_{m-1}\}$ through an exhaustive search method to minimize a Hamming distance between two outputs.

Further, Step 2 specifically comprises:

Obtaining the overlapping areas of two adjacent Gaussian distribution functions based on the MLC flash decoding curve;

Sensing the overlapping areas with preset high quantization precision and sensing other areas with preset low quantization precision, that is, setting a difference between adjacent read thresholds of the overlapping area to be less than a difference between adjacent read thresholds of non-overlapping areas, so that a width W exits between each threshold obtained by extension and an adjacent optimal threshold; and obtaining six extended read thresholds according to formula (2):

$$\begin{cases} B^*_{2i-1} = R^*_i - W_{2i-1} \\ B^*_{2i} = R^*_i + W_{2i} \end{cases} \quad (2)$$

Wherein, i=1, 2, 3, $R^*_i \in (B^*_{2i-1}, B^*_{2i})$.

Further, Step S3 specifically comprises: determining seven corresponding quantization intervals based on the six extended read thresholds, wherein each memory cell of MLC flash stores two bits and has four voltage states correspondingly, a left bit is called a most significant bit and is denoted by MSB, and a right bit is called a least significant bits and is denoted by LSB;

Constructing the LLR mapping table, and obtaining an LLR corresponding to each bit C of the storage symbol based on the LLR mapping table.

Further, Step S4 specifically comprises:

Defining $f_0(L)$ and $f_1(L)$ as probability density functions of LLRs, corresponding to c=0 and c=1 in the memory cells respectively; and reversing all LLR symbols of c=0, wherein a probability density of the LLRs after channel symmetrization is:

$$f_s(L) = \frac{1}{2}(f_0(-L) + f_1(L)) \quad (3)$$

Defining $a_N^{(i)}$ as a probability density function of the LLR of an $i^{th}$ sub-channel;

Then, calculating $a_N^{(i)}$ of each sub-channel according to formulas $a_{2N}^{(2i-1)} = a_N^{(i)} \odot a_N^{(i)}$, $a_{2N}^{(2i)} = a_N^{(i)} * a_N^{(i)}$, $a_1^{(1)} = f_s(\hat{L})$; calculating a code error probability of each sub-channel after $a_N^{(i)}$ of each sub-channel is obtained; and $$P_e^{(i)} = \lim_{\varepsilon \to +0} \left( \int_{-\infty}^{-\varepsilon} a_N^{(i)} dx + \frac{1}{2} \int_{-\varepsilon}^{+\varepsilon} a_N^{(i)} dx \right) \quad (4)$$

Adding K minimum $P_e^{(i)}$ through a discretized density evolution method to obtain a block error rate formula $$P_B = \sum_{k \in A} P_e^{(i)}$$

of SC decoding, wherein A is an information bit set.

Further, Step S5 specifically comprises:

Obtaining an optimal set $\{W_1^*, W_2^*, \ldots, W_6^*\}$ through the genetic algorithm, wherein an objective function is $P_B$; and $$\{W_1^*, W_2^*, \ldots, W_6^*\} = \underset{\{W_1, W_2, \ldots, W_6\}}{\operatorname{argmin}} P_B \quad (5)$$

Obtaining six optimal soft-decision read thresholds $\{B^*_1, B^*_2, \ldots, B^*_6\}$ according to the optimal set $\{W_1^*, W_2^*, \ldots, W_6^*\}$, so that seven optimal quantization intervals for a Polar-code MLC flash channel are obtained.

Compared with the prior art, the invention has the following beneficial effects:

According to the invention, polar codes can be directly used for MLC flash channels without the arduous work of MLC flash channel modeling, so that the reliability of MLC flash is effectively improved.

DETAILED DESCRIPTION OF THE INVENTION

The invention will be further expounded below in conjunction with the accompanying drawings and embodiments.

Figure 1:
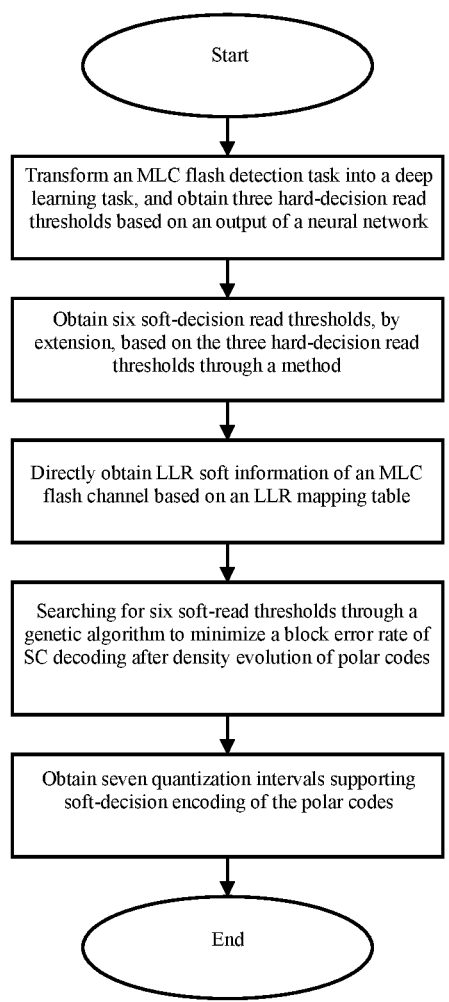
FIG. 1 is a flow diagram of a method according to the invention.
Figure 2:
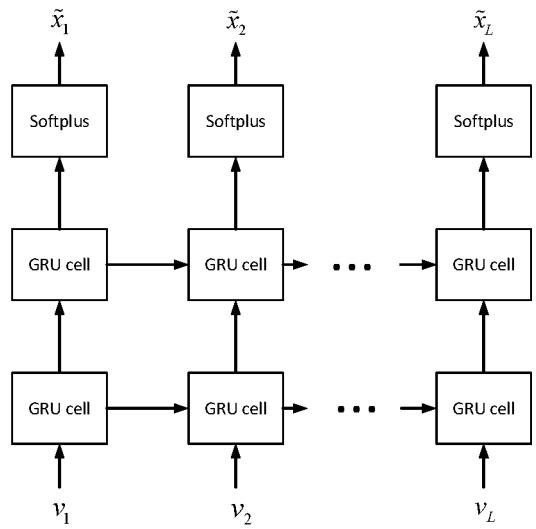
FIG. 2 is an architecture diagram of the RNN detector in one embodiment of the invention.

Referring to FIG. 1, the invention provides a method for optimizing a Polar-RNNA quantizer of MLC NAND flash based on deep learning, comprising the following steps:

Step S1: a read-back voltage of a $k^{th}$ memory cell of MLC flash is expressed by $v_k$, $v=\{v_1, v_2, \ldots, v_L\}$ is input to a neural network, L is set as the number of neurons of an input layer, and the neural network outputs a soft estimation $\tilde{x}=\{\tilde{x}_1, \tilde{x}_2, \ldots, \tilde{x}_L\}$ of a tag x (storage symbol);

As for the MLC flash, a tag $\{0, 1, 2, 3\}$ is used to express $\{11, 10, 00, 01\}$, so that a hard estimation $\hat{x}_k \in \{0, 1, 2, 3\}$ of a $k^{th}$ memory cell $x_k \in \{0, 1, 2, 3\}$ is obtained by acquiring integers $\tilde{x}_k$ most approximate to $\tilde{x}$ output by the neural network; then, a corresponding memory cell symbol is obtained according to a mapping $\{0, 1, 2, 3\} \rightarrow \{11, 10, 00, 01\}$, wherein FIG. 2 is an architecture diagram of an RNN detector, and Table 1 illustrates parameter selection of an RNN network;

TABLE 1

| | |
|---|---|
| Number of training samples (symbols) | $3 \times 10^6$ |
| Mini-batch size | 100 |
| Loss function | MSE |
| Initializer | Xavier uniform |
| Optimizer | Adam |

A set of read thresholds $\{R_1, R_2, R_3\}$ is set for a read-back voltage of $\vec{v}$ a given set of memory cells to obtain a hard estimation of a memory cell symbol, which is denoted by $\bar{x}$; $\vec{v}$ is input to an RNN detector to obtain a hard estimation $\hat{x}$ of the storage symbol based on the principle of proximity;

N RNN output sequences with a length L are set during the search process, and the $i^{th}$ output sequence is denoted by $\hat{x}_i$, so that $\hat{X}=\{\hat{x}_1, \hat{x}_2, \ldots, \hat{x}_N\}$, and $\bar{X}=\{\bar{x}_1, \bar{x}_2, \ldots, \bar{x}_N\}$;

Wherein, a formula for calculating optimal thresholds $\{R^*_1, R^*_2, R^*_3\}$ is:

$$\{R^*_1, R^*_2, R^*_3\} = \underset{\{R_1, R_2, R_3\}}{\operatorname{argmin}} d(\bar{X}, \hat{X}) \quad (1)$$

A search space is uniformly quantized into m interval boundaries $\{B_0, B_1, \ldots, B_m\}$, wherein $B_0=-\infty<B_1=V_{s_1}<\ldots<B_{m-1}=V_{s_{Q_1}}<B_m=\infty$;

Optimal thresholds $\{R^*_1, R^*_2, R^*_3\}$ are searched out from $\{B_1, B_2, \ldots, B_{m-1}\}$ through an exhaustive search method to minimize a Hamming distance between two outputs.

Step 2: six soft-decision read thresholds are obtained by extension based on the three hard-decision read thresholds.

Figure 3:
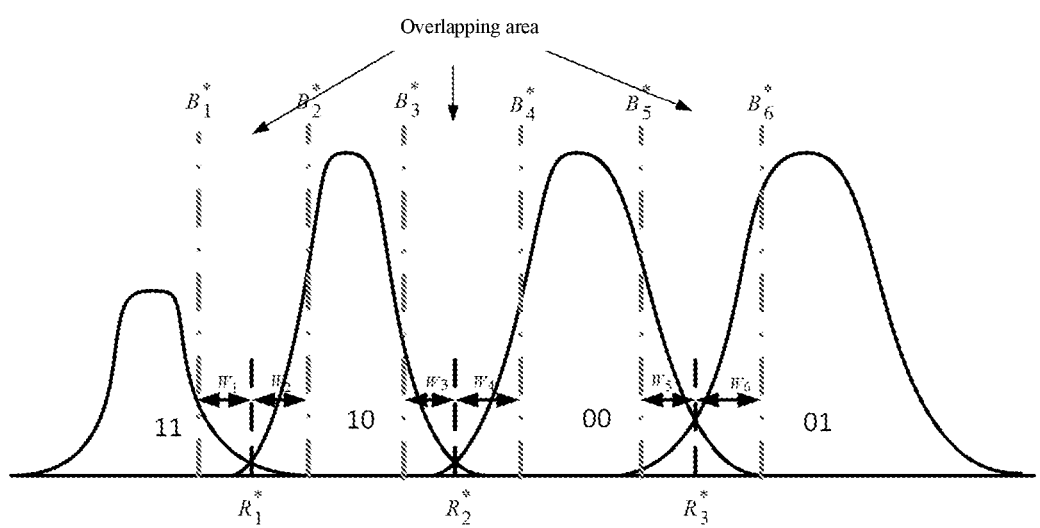
FIG. 3 is a schematic diagram of six soft-read thresholds designed according to three hard-decision read thresholds in one embodiment of the invention.

In this embodiment, as shown in FIG. 3, an overlapping area of two adjacent Gaussian distribution functions is obtained according to an MLC flash decoding curve;

The overlapping area is sensed with preset high quantization precision and other areas are sensed with preset low quantization precision, that is, a difference between adjacent read thresholds of the overlapping area is less than a difference between adjacent read thresholds of non-overlapping areas, so that a width W exits between each extended threshold and an adjacent optimal threshold; and six extended read thresholds are obtained according to formula (2):

$$\begin{cases} B^*_{2i-1} = R^*_i - W_{2i-1} \\ B^*_{2i} = R^*_i + W_{2i} \end{cases} \quad (2)$$

Wherein, i=1, 2, 3, $R^*_i \in (B^*_{2i-1}, B^*_{2i})$.

Step S3: an LLR mapping table is constructed, and LLR soft information of the MLC flash is obtained based on the LLR mapping table;

Seven corresponding quantization intervals are determined according to the six extended read thresholds, wherein each memory cell of MLC flash stores two bits and has four voltage stages correspondingly, a left bit is called a most significant bit (MSB), and a right bit is called a least significant bits (LSB); and The LLR mapping table is constructed, and an LLR ($\hat{L}_{MSB}$ and $\hat{L}_{LSB}$) corresponding to each bit C of the storage symbol is obtained based on the LLR mapping table.

TABLE 2

| Quantization intervals | $\hat{L}_{MSB}$ | $\hat{L}_{LSB}$ |
|---|---|---|
| [B₀*, B₁*) | −5 | −1 |
| [B₁*, B₂*) | −3 | 0 |
| [B₂*, B₃*) | −1 | 1 |
| [B₃*, B₄*) | 0 | 3 |
| [B₄*, B₅*) | 1 | 1 |
| [B₅*, B₆*) | 3 | 0 |
| [B₆*, B₇*) | 5 | −1 |

Step S4: the precondition of density evolution of polar codes is channel symmetrization, so the MLC flash channel is symmetrized, $f_0(\hat{L})$ and $f_1(\hat{L})$ are defined as probability density functions of LLRs, wherein $f_0(\hat{L})$ and $f_1(\hat{L})$ respectively correspond to c=0 and c=1 in the memory cells; and all LLR symbols of c=0 are reversed, wherein the probability density of LLR after channel symmetrization is:

$$f_s(\hat{L}) = \frac{1}{2}(f_0(-\hat{L}) + f_1(\hat{L})) \quad (3)$$

$a_N^{(i)}$ is defined as a probability density function of the LLR of an $i^{th}$ sub-channel;

Then, $a_N^{(i)}$ of each sub-channel is calculated according to formulas $a_{2N}^{(2i-1)} = a_N^{(i)} \boxdot a_N^{(i)}$, $a_{2N}^{(2i)} = a_N^{(i)} * a_N^{(i)}$, $a_1^{(1)} = f_s(\hat{L})$; a code error probability of each sub-channel is calculated after $a_N^{(i)}$ of each sub-channel is obtained; and $$P_e^{(i)} = \lim_{\varepsilon \to +0} \left( \int_{-\infty}^{-\varepsilon} a_N^{(i)} dx + \frac{1}{2} \int_{-\varepsilon}^{+\varepsilon} a_N^{(i)} dx \right) \quad (4)$$

K minimum $P_e^{(i)}$ are added through a discretized density evolution method to obtain a block error rate formula $$P_B = \sum_{k \in A} P_e^{(i)}$$

of SC coding, wherein A is an information bit set (K elements).

Step S5: an optimal set $\{W^*_1, W^*_2, \ldots, W^*_6\}$ is obtained through a genetic algorithm, wherein an objective function is $P_B$ $$\{W^*_1, W^*_2, \ldots, W^*_6\} = \underset{\{W_1, W_2, \ldots, W_6\}}{\operatorname{argmin}} P_B \quad (5)$$

Six optimal soft-decision read thresholds $\{B^*_1, B^*_2, \ldots, B^*_6\}$ are obtained according to the optimal set $\{W^*_1, W^*_2, \ldots, W^*_6\}$, that is, seven optimal quantization intervals for a Polar-code MLC channel are obtained.

Those skilled in the art would appreciate that the embodiments of the application can be provided as a method, a system or a computer program product. So, the application may be implemented in the form of a completely hardware embodiment, a completely software embodiment, or an embodiment combining software and hardware. In addition, the application may be in the form of a computer program product to be implemented on one or more computer-available storage media (including, but not limited to, a disk memory, a CD-ROM, an optical memory, and the like) comprising computer-available program codes.

The application is described with reference to the flow diagram and/or block diagram of the method, device (system) and computer program product provided by the embodiments of the application. It should be understood that each process and/or block in the flow diagram and/or block diagram and the combinations of processes and/or blocks in the flow diagram and/or block diagram can be implemented by computer program instructions. These computer program instructions can be configured in a general-purpose computer, a special-purpose computer, an embedded processor, or a processor of other programmable data processing terminals to create a machine, so that the instructions can be executed by the computer or the processor of other programmable data processing terminals to create a device for realizing specific functions in one or more processes in the flow diagram and/or in one or more blocks in the block diagram.

These computer program instructions may also be stored in a computer-readable memory that can guide the computer or other program data processing terminals to work in a specific manner, so that the instructions stored in the computer-readable memory can create a product including an instruction device, and the instruction device implements specific functions in one or more processes of the flow diagram and/or one or more blocks in the block diagram.

These compute r program instructions may also be loaded on a computer or other programmable data processing terminal devices, so that the computer or other programmable terminal devices can perform a series of operation steps to carry out processing realized by the computer, and the instructions are executed on the computer or other programmable terminal devices to realize specific functions in one or more processes in the flow diagram and/or one or more block diagrams in the block diagram.

The above embodiments are merely preferred ones of the invention, and are not used to limit the invention in any form. Any skilled in the art can obtain other equivalent embodiments by changing or modifying the technical contents disclosed above. Any simple amendments and equivalent transformations and modifications made to the above embodiments according to the technical essence of the invention without departing from the contents of the technical solutions of the invention still fall within the protection scope of the technical solutions of the invention.

What is claimed is:

1. A method for optimizing a Polar-RNNA quantizer of MLC NAND flash memory based on deep learning, comprising the following steps:

Step S1: transforming an MLC flash detection task into a deep learning task, and obtaining three hard-decision read thresholds based on a neural network;

Step S2: expanding six soft-decision read thresholds based on the three hard-decision read thresholds;

Step S3: constructing an LLR mapping table, and obtaining LLR soft information of the MLC flash based on the LLR mapping table;

Step S4: symmetrizing the MLC flash channel, and performing density evolution; and Step S5: optimizing the soft-decision read thresholds based on a genetic algorithm to obtain optimal quantization intervals;

Step S2 specifically comprises:

obtaining the overlapping areas of two adjacent Gaussian distribution functions based on the MLC flash decoding curve;

sensing the overlapping areas with preset high quantization precision and sensing other areas with preset low quantization precision, that is, setting a difference between adjacent read thresholds of the overlapping area to be less than a difference between adjacent read thresholds of non-overlapping areas, so that a width W exits between each thresholds obtained by extension and an adjacent optimal threshold; and obtaining six extended read thresholds according to formula (2):

$$\begin{cases} B^*_{2i-1} = R^*_i - W_{2i-1} \\ B^*_{2i} = R^*_i + W_{2i} \end{cases} \quad (2)$$

Wherein, i=1, 2, 3, $R^*_i \in (B^*_{2i-1}, B^*_{2i})$;

Step S3 specifically comprises: determining seven corresponding quantization intervals according to the six extended read thresholds, wherein each memory cell of MLC flash stores two bits and has four voltage stages correspondingly, a left bit is called a most significant bit and is denoted by MSB, and right bit is called a least significant bits and is denoted by LSB; and constructing the LLR mapping table, and obtaining an LLR corresponding to each bit c of a storage symbol based on the LLR mapping table;

Step S5 specifically comprises:

obtaining an optimal set $\{W^*_1, W^*_2, \ldots, W^*_6\}$ through the genetic algorithm, wherein an objective function is $P_B$; and $$\{W^*_1, W^*_2, \ldots, W^*_6\} = \underset{\{W_1, W_2, \ldots, W_6\}}{\operatorname{argmin}} P_B \quad (5)$$

obtaining six optimal soft-decision read thresholds $\{B^*_1, B^*_2, \ldots, B^*_6\}$ according to the optimal set $\{W^*_1, W^*_2, \ldots, W^*_6\}$, so that seven optimal quantization intervals for a Polar-code MLC flash channel are obtained.

2. The method for optimizing a Polar-RNNA quantizer of MLC NAND flash memory based on deep learning according to claim 1, wherein Step S1 specifically comprises:

devoting a read-back voltage of a $k^{th}$ memory cell of the MLC flash by $V_k$, inputting $v=\{v_1, v_2, \ldots, v_L\}$ to the neural network, and setting L as the number of neurons of an input layer, and outputting a soft estimation $\tilde{x} = \{\tilde{x}_1, \tilde{x}_2, \ldots, \tilde{x}_L\}$ of a tag x by the neural network;

as for the MLC flash, expressing {11,10,00,01} by a tag {0,1,2,3}, so that a hard estimation $\hat{X}_k \in \{0,1,2,3\}$ of the $k^{th}$ memory cell $x_k \in \{0,1,2,3\}$ is obtained by acquiring integers $\hat{X}_k$ most approximate to $\tilde{x}$ output by the neural network; then, obtaining a corresponding memory cell symbol through a mapping $\{0,1,2,3\} \rightarrow \{11,10,00,01\}$;

setting a set of read thresholds $\{R_1, R_2, R_3\}$ for a read-back voltage $\vec{v}$ of a given set of memory cells to obtain a hard estimation of the memory cell symbol, which is denoted by $\tilde{x}$; inputting $\vec{v}$ to an RNN detector to obtain a hard estimation $\hat{X}$ of a storage symbol based on a principle of proximity;

setting, during a search process, N RNN output sequences with a length of L, and denoting an $i^{th}$ RNN output sequence as $\hat{X}_i$, so that $\hat{X} = \{\hat{x}_1, \hat{x}_2, \ldots, \hat{x}_N\}$, and $\overline{X} = \{\overline{x}_1, \overline{x}_2, \ldots, \overline{x}_N\}$;

wherein, a formula for calculating optimal thresholds $\{R^*_1, R^*_2, R^*_3\}$ is:

$$\{R^*_1, R^*_2, R^*_3\} = \underset{\{R_1, R_2, R_3\}}{\operatorname{argmin}} d(\overline{X}, \hat{X}) \quad (1)$$

uniformly quantizing a search space into m interval boundaries $\{B_0, B_1, \ldots, B_m\}$, wherein $B_0 = -\infty < B_1 = V_{s_{11}} < \ldots < B_{m-1} = V_{s_{0j}} < B_m = \infty$; and searching out the optimal thresholds $\{R^*_1, R^*_2, R^*_3\}$ from $\{B_1, B_2, \ldots, B_{m-1}\}$ through an exhaustive search method to minimize a Hamming distance between two outputs.

3. The method for optimizing a Polar-RNNA quantizer of MLC NAND flash memory based on deep learning according to claim 1, wherein Step S4 specifically comprises:

defining $f_0(\hat{L})$ and $f_1(\hat{L})$ as probability density functions of LLRs, corresponding to c=0 and c=1 in the memory cells respectively; and reversing all LLR symbols of c=0, wherein a probability density of the LLRs after channel symmetrization is:

$$f_s(\hat{L}) = 1/2 \, (f_0(-\hat{L}) + f_1(\hat{L})) \quad (3)$$

defining $a_N^{(i)}$ as a probability density function of the LLR of an $i^{th}$ sub-channel;

then, calculating $a_N^{(i)}$ of each sub-channel according to formulas $a_{2N}^{(2i-1)} = a_N^{(i)} \odot a_N^{(i)}$, $a_{2N}^{(2i)} = a_N^{(i)} * a_N^{(i)}$, $a_1^{(1)} = f_s(\hat{L})$; calculating a code error probability of each sub-channel after $a_N^{(i)}$ of each sub-channel is obtained; and $$P_e^{(i)} = \lim_{\varepsilon \to +0} \left( \int_{-\infty}^{-\varepsilon} a_N^{(i)} dx + \frac{1}{2} \int_{-\varepsilon}^{+\varepsilon} a_N^{(i)} dx \right) \quad (4)$$

adding K minimum $P_e^{(i)}$ through a discretized density evolution method to obtain a block error rate formula $$P_B = \sum_{i \in A} P_e^{(i)} \qquad 5$$

of SC decoding, wherein A is an information bit set.

* * * * *